US009942495B2

United States Patent
Lukac et al.

(10) Patent No.: US 9,942,495 B2
(45) Date of Patent: *Apr. 10, 2018

(54) IMAGING ARRAY HAVING PHOTODIODES WITH DIFFERENT LIGHT SENSITIVITIES AND ASSOCIATED IMAGE RESTORATION METHODS

(71) Applicant: Foveon, Inc., San Jose, CA (US)

(72) Inventors: Rastislav Lukac, San Jose, CA (US); Shri Ramaswami, San Jose, CA (US); Sanghoon Bae, San Jose, CA (US)

(73) Assignee: Foveon, Inc., San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 14/942,700

(22) Filed: Nov. 16, 2015

(65) Prior Publication Data

US 2016/0073046 A1   Mar. 10, 2016

Related U.S. Application Data

(63) Continuation of application No. 13/550,436, filed on Jul. 16, 2012, now Pat. No. 9,191,556.

(60) Provisional application No. 61/511,661, filed on Jul. 26, 2011.

(51) Int. Cl.
| | |
|---|---|
| H04N 5/355 | (2011.01) |
| H01L 27/146 | (2006.01) |
| H04N 5/217 | (2011.01) |
| H04N 9/04 | (2006.01) |

(52) U.S. Cl.
CPC ... *H04N 5/35563* (2013.01); *H01L 27/14623* (2013.01); *H01L 27/14627* (2013.01); *H04N 5/2173* (2013.01); *H04N 9/045* (2013.01)

(58) Field of Classification Search
CPC .. H04N 5/35563; H04N 9/045; H04N 5/2173; H01L 27/14623; H01L 27/14627
See application file for complete search history.

(56) References Cited

U.S. PATENT DOCUMENTS

| | | | |
|---|---|---|---|
| 6,487,271 | B1 | 11/2002 | Laurent |
| 6,642,960 | B1 | 11/2003 | Kohashi et al. |
| 6,937,362 | B1 | 8/2005 | Spaulding et al. |
| 7,593,603 | B1 | 9/2009 | Wilensky |
| 8,537,234 | B2 | 9/2013 | Litvinov et al. |
| 9,191,556 | B2 * | 11/2015 | Lukac |
| 2003/0222991 | A1 | 12/2003 | Muammar et al. |
| 2004/0017498 | A1 | 1/2004 | Yamashita et al. |
| 2005/0140804 | A1 | 6/2005 | Adams, Jr. et al. |

(Continued)

FOREIGN PATENT DOCUMENTS

| | | |
|---|---|---|
| CN | 101931756 | 12/2010 |
| CN | 102104053 | 6/2011 |

(Continued)

OTHER PUBLICATIONS

Japanese Patent Office, Office Action issued in Japanese patent application No. 2012-165575, dated Mar. 4, 2016, 6 pages.
State Intellectual Property Office, Search Report issued in Chinese patent application No. 201210262403.4, dated May 26, 2015, 3 pages.
Xu et al., "Correction of clipped pixels in color images," IEEE Trans. Visualization and Computer Graphics, vol. 17, No. 3, pp. 333-344, Mar. 2011.

(Continued)

*Primary Examiner* — Gevell Selby
(74) *Attorney, Agent, or Firm* — Glass and Associates; Kenneth Glass; Ken D'Alessandro

(57) ABSTRACT

A pixel sensor array includes a plurality of pixel sensors having a first gain and a plurality of pixel sensors having a second gain less than the first gain.

12 Claims, 8 Drawing Sheets

(56) References Cited

U.S. PATENT DOCUMENTS

| | | | |
|---|---|---|---|
| 2006/0072924 A1 | 4/2006 | Lee et al. | |
| 2008/0173794 A1 | 7/2008 | Oike et al. | |
| 2009/0314928 A1* | 12/2009 | Parks | H01L 27/14629 250/208.1 |
| 2010/0253799 A1* | 10/2010 | Mabuchi | H04N 5/35563 348/222.1 |
| 2010/0277607 A1* | 11/2010 | Choi | H04N 5/35554 348/222.1 |
| 2011/0141333 A1 | 6/2011 | Naruse et al. | |
| 2011/0228149 A1 | 9/2011 | Naruse et al. | |
| 2012/0249817 A1* | 10/2012 | Ishii | H04N 5/335 348/220.1 |

FOREIGN PATENT DOCUMENTS

| | | |
|---|---|---|
| EP | 1209903 A1 | 5/2002 |
| JP | 2002199287 | 7/2002 |
| JP | 2003060983 A | 2/2003 |
| JP | 2006191114 A | 7/2006 |
| JP | 2009284010 | 12/2009 |
| WO | 2011074486 | 6/2011 |

OTHER PUBLICATIONS

Xu et al., "Saturated-Pixel Enhancement for Color Images," in Proceedings of 2010 IEEE International Symposium on Circuits and Systems (ISCAS), May 30-Jun. 2, 2010, Paris, France, pp. 3377-3380.

Mansour et al., "Color image desaturation using sparse reconstruction," in Proc. IEEE Int. Conf. Acoust., Speech, Signal Process., Dallas, TX, Mar. 2010, pp. 778-781.

Soriano et al., "Making saturated facial images useful again", Proc. SPIE 3826, Polarization and Color Techniques in Industrial Inspection, 113 (Sep. 16, 1999).

Zhang et al., "Estimation of saturated pixel values in digital color imaging," J. Opt. Soc. Am. A, vol. 21, No. 12, pp. 2301-2310, 2004.

Korean Intellectual Property Office, Office Action issued in Korean patent application No. 10-2012-0081335, dated Jun. 14, 2016, 7 pages.

State Intellectual Property Office, Office Action issued in Chinese patent application No. 201210262403.4, dated Jan. 6, 2016, 11 pages.

* cited by examiner

IMAGING ARRAY HAVING PHOTODIODES WITH DIFFERENT LIGHT SENSITIVITIES AND ASSOCIATED IMAGE RESTORATION METHODS

RELATED APPLICATIONS

This application is a continuation of U.S. patent application Ser. No. 13/550,436, filed Jul. 16, 2012, which claims the benefit of U.S. Provisional Application No. 61/511,661, filed on Jul. 26, 2011, U.S. Provisional Application No. 61/487,887, filed May 19, 2011and U.S. patent application Ser. No. 13/473,313, filed May 16, 2012, now U.S. Pat. No. 8,842,912, issued Sep. 23, 2014 the contents of which are incorporated herein by reference in their entirety.

BACKGROUND

1. Field of the Invention

The present invention relates to photosensors and to imaging arrays of photosensors. More particularly, the present invention relates to imaging arrays formed using pixels having different light sensitivities and to methods for restoring visual information in digital images captured using such imaging arrays.

2. The Prior Art

An image sensor is an array of light-sensitive cells (photosensors) usually formed as photodiodes. The quality and dynamic range of images is limited by the nature of the pixel sensors themselves, particularly in bright image regions where sensor cells usually saturate, that is, reach the maximum charge that the sensors can collect. Exceeding the saturation level produces blooming artifacts in captured images.

BRIEF DESCRIPTION

An image sensor is an array of light-sensitive cells (photosensors) usually formed as photodiodes. Unlike traditional image sensors that employ photosensors all having the same light sensitivity, the present invention presents a sensor that employs photodiodes having different light sensitivities. The present invention enhances both the quality and dynamic range of images, particularly in bright image regions where sensor cells usually saturate.

To overcome the problem inherent in prior-art image sensors, the present invention is directed to an image sensor that includes both photodiodes having normal light sensitivity and photodiodes having lower light sensitivity. Photodiodes having normal light sensitivity aim at capturing visual information associated with light intensities ranging from low values to high values that are not saturated. Photodiodes having lower light sensitivity aim at capturing visual information in regions with highlights where photodiodes having normal light sensitivity usually saturate. The lower sensitivity of photodiodes can be achieved in several different ways, for example, by blocking the light falling at the photodiode or changing the capacitance of the photodiode.

In regions which are not saturated, high-quality image information is restored by bringing pixel values corresponding to photodiodes having lower light sensitivity to the level of pixel values corresponding to photodiodes having normal light sensitivity by applying the appropriate gains. These gains, referred to herein as highlight pixel gains, are usually obtained in calibration. Alternatively, the highlight pixel gain of any highlight pixel can be calculated as a ratio of the average value or weighted average value (for example, using Gaussian weights) of nonsaturated normal light sensitivity pixels available in the neighborhood of the highlight pixel and the highlight pixel value. An alternative solution can aim at restoring the pixel values corresponding to photodiodes having lower light sensitivity using neighboring pixel values corresponding to photodiodes having normal light sensitivity by means of image interpolation or signal estimation.

Methods are disclosed for restoring highlights in digital images combining the pixels having reduced sensitivities in accordance with the present invention.

The concept introduced in the present invention is applicable to any photodiode layout, such as various periodic, pseudo-random, and random arrangements of photodiodes having lower light sensitivity in the array of photodiodes having normal light sensitivity. In addition, the present invention is not limited to any particular sensitivity setting, as the presented concept is flexible and allows for photodiodes having different sensitivities.

BRIEF DESCRIPTION OF THE DRAWING FIGURES

DETAILED DESCRIPTION

Persons of ordinary skill in the art will realize that the following description of the present invention is illustrative only and not in any way limiting. Other embodiments of the invention will readily suggest themselves to such skilled persons.

Imaging arrays according to the present invention include pixel sensors having two different light-sensitivities. A first plurality of pixel sensors have a first light-sensitivity and a second plurality of pixel sensors have a second light-sensitivity less than the first light-sensitivity. The first plurality of pixels are sometimes referred to herein as "normal"

pixels and the second plurality of pixels are sometimes referred to herein as "highlight" pixels.

Figure 1:
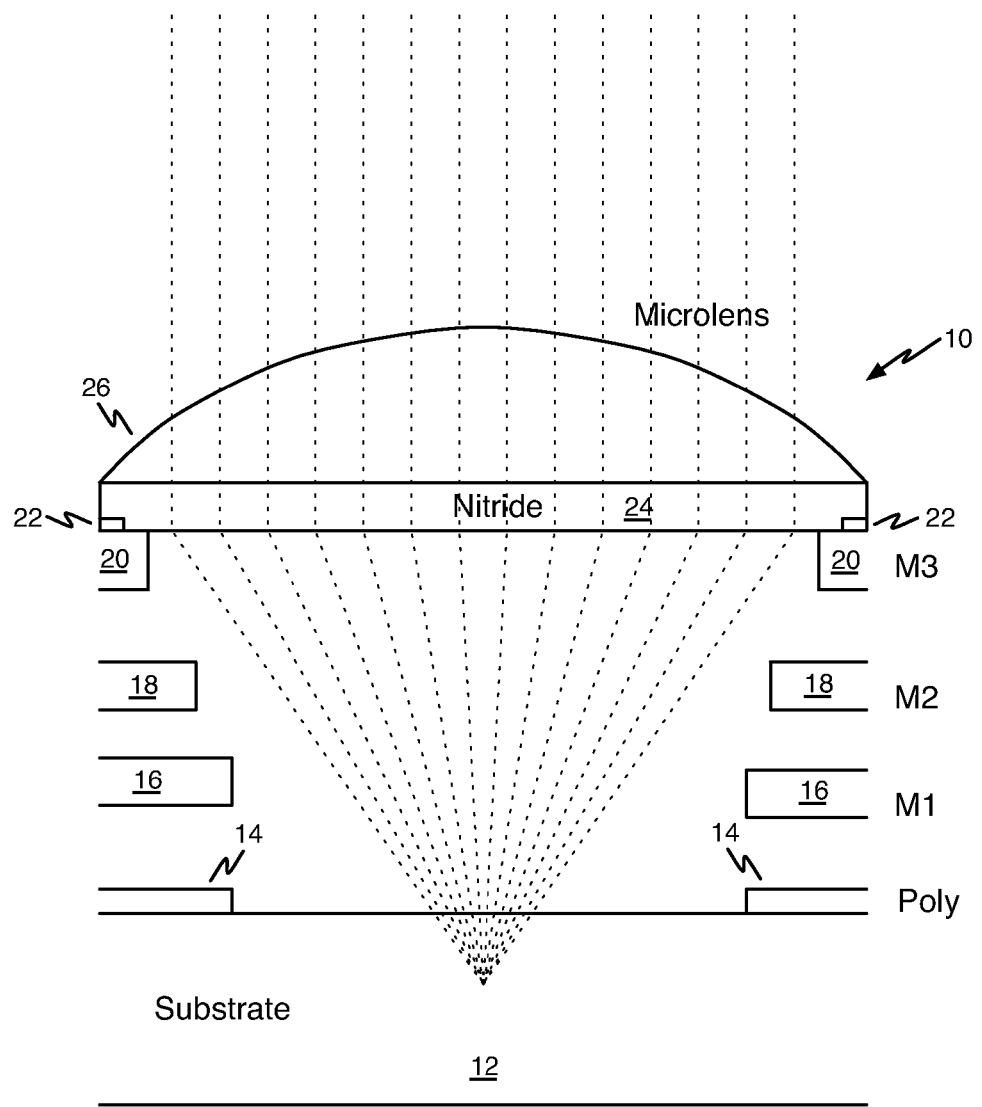
FIG. 1 is a cross-sectional view of a typical prior-art pixel.

Referring first to FIG. 1, a cross-sectional view of a normal pixel 10 is shown. The photosensor (not shown) is formed in substrate 12. A portion of a layer of polysilicon 14, used to fabricate the transistors which are necessary to operate the pixel is shown disposed over the substrate. In addition, portions of three illustrative metal interconnect layers 16, 18, and 20 are shown. A CMOS image sensor can have fewer or more layers of metal depending on the technology chosen. As shown in FIG. 1, the polysilicon layer 14 and metal interconnect layers 16, 18, and 20 are not located over the photo-diode because they absorb visible light.

Portions of a grid 22 that defines pixel areas is shown in FIG. 1. A planarization/passivation layer 24 may be disposed over the surface of the pixel. This layer may be formed from a polymer layer and or a nitride layer. A microlens 26 may be formed over the planarization/passivation layer as is known in the art. A microlens is used to focus the incoming light onto the photosensor(s) in the pixel.

In some imaging arrays, a dark light shield is typically used to intentionally block out all light over columns and rows on the edge of the pixel array. These dark columns and rows provide data to characterize sources of noise for the imager.

Figure 2:
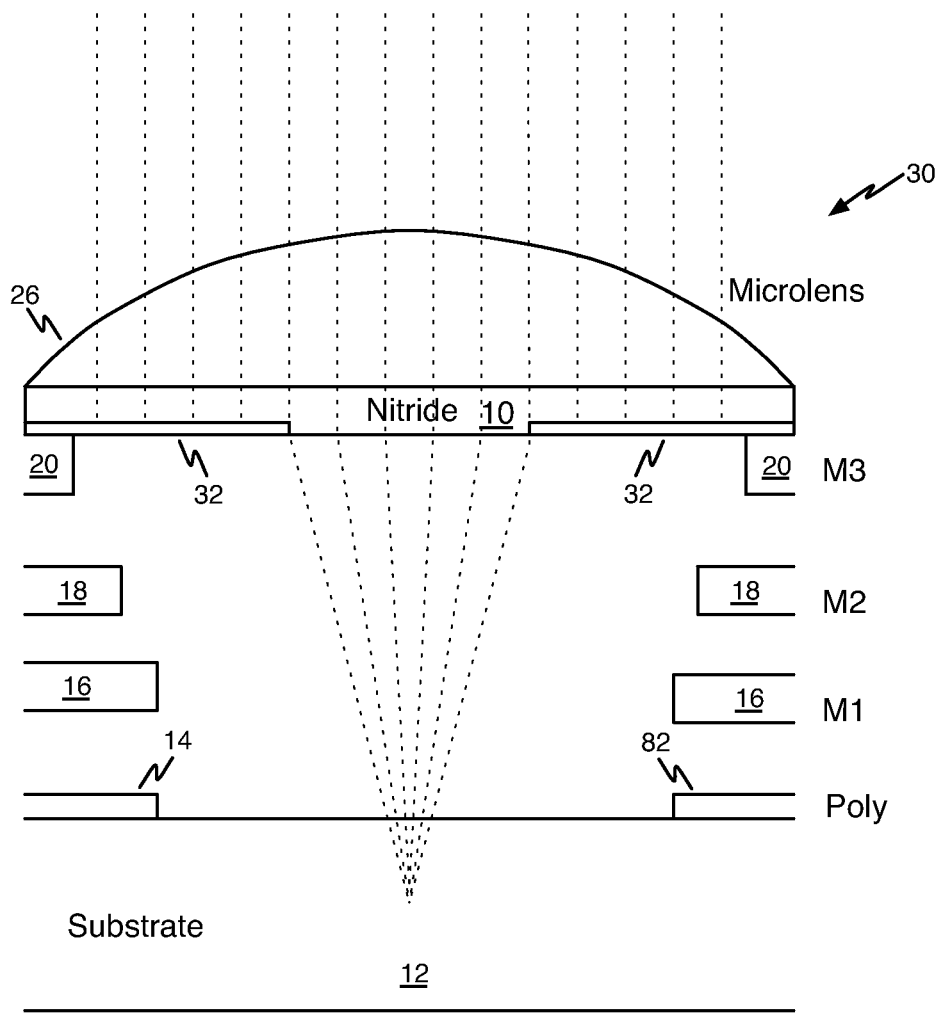
FIG. 2 is a cross-sectional view of a reduced-sensitivity pixel in accordance with one aspect of the present invention.

Referring now to FIG. 2, a cross-sectional view of a reduced-sensitivity pixel 30 in accordance with one aspect of the present invention is shown. As in pixel 10 of FIG. 1, pixel 30 includes a photosensor (not shown) formed in substrate 12. A portion of a layer of polysilicon 14 is shown disposed over the substrate and portions of three illustrative metal interconnect layers 16, 18, and 20 are shown.

A planarization/passivation layer 24 is disposed over the surface of the pixel and a microlens 26 is formed over the planarization/passivation layer 24 as is known in the art. Microlens 26 is used to focus the incoming light onto the photosensor(s) in the pixel. However, unlike pixel 10 of FIG. 1, pixel 30 of FIG. 2 has a reduced aperture size created by a layer of dark shield material 32. Dark shield material 32 could be any metal used in back-end-of-line (BEOL) processing because the metals used in BEOL are optically opaque.

Persons of ordinary skill in the art will appreciate that, while dark shield material 32 is shown disposed at or near the surface of the pixel, portions of any metal layer or combination of multiple metal layers can be used to block a portion of incident light so that the resulting sensitivity become lower than the sensitivity of normal pixel. Either a metal or any other material compatible with the process and having low optical transmittance can be chosen as a light shield material. If a grid 22 as shown in FIG. 1 is used, it can be patterned to have smaller apertures over reduced-sensitivity pixels like pixel 30.

Figure 3:
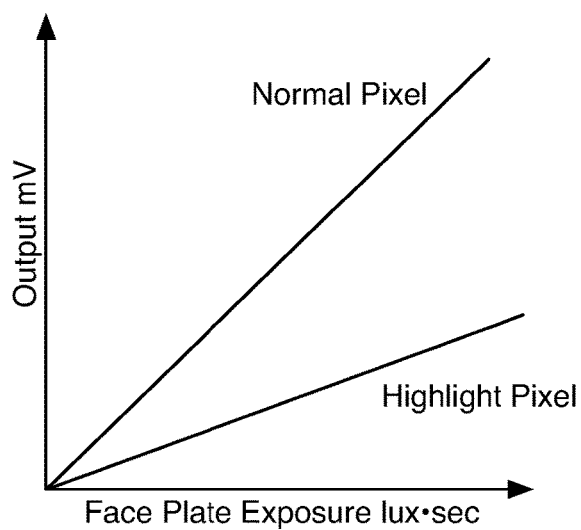
FIG. 3 is a graph of face-plate exposure vs. pixel output for both a normal pixel and a reduced-sensitivity pixel.

According to one aspect of the present invention, a partial light shield is created with an aperture adjusted to provide half to one-eighth of the light entering the pixel. This concept is illustrated in FIGS. 1 and 2 where the two-dimensional light-ray tracings are shown in dashed lines in the cross-sections. FIG. 1 shows the light-ray trace for the normal pixel 10 while FIG. 2 depicts the use of the dark metal with an opening to allow only approximately one-quarter of the light that enters the FIG. 1 pixel 10 to enter pixel 30. FIG. 3 is a graph that shows face-plate exposure vs. pixel output for both the normal pixel of FIG. 1 and the reduced-sensitivity pixel of FIG. 2.

An illustrative target range for the reduced sensitivity pixel is typically about half to one-eighth of a normal pixel although persons of ordinary skill in the art will readily realize that other ranges may be used. For example, if the amount of light entering the pixel is cut to one quarter of the light entering a normal pixel, then the sensitivity would be approximately one-fourth that of the normal pixel. To manufacture photodiodes having reduced light sensitivity when compared to a typical pixel for a given technology, a light shield will be employed. It will block a portion of the light entering those pixels targeted for reduced sensitivity. As will be readily appreciated by persons of ordinary skill in the art, the smaller the aperture is in the light shield, the more light-sensitivity reduction is obtained.

Figure 4:
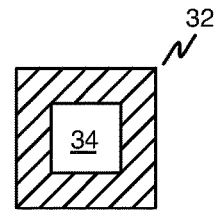
FIG. 4 is a diagram showing one illustrative embodiment of a light shield for a reduced-sensitivity pixel in accordance with the present invention.
Figure 5:
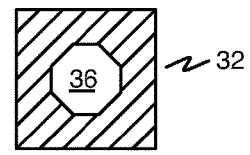
FIG. 5 is a diagram showing another illustrative embodiment of a light shield for a reduced-sensitivity pixel in accordance with the present invention.

The light shield for the reduced sensitivity pixel could be implemented in several ways. Referring now to FIGS. 4 and 5, two exemplary geometrical layouts for a light shield for a reduced-sensitivity pixel in accordance with the present invention are shown. FIG. 4 shows a light shield 32 having a square aperture 34. Persons of ordinary skill in the art will realize that other variations in shape can be used for the aperture. For instance, octagonal aperture 36 as shown in FIG. 5 in light shield 32, a circular, or a square aperture with chamfered corners could be employed.

Figure 6:
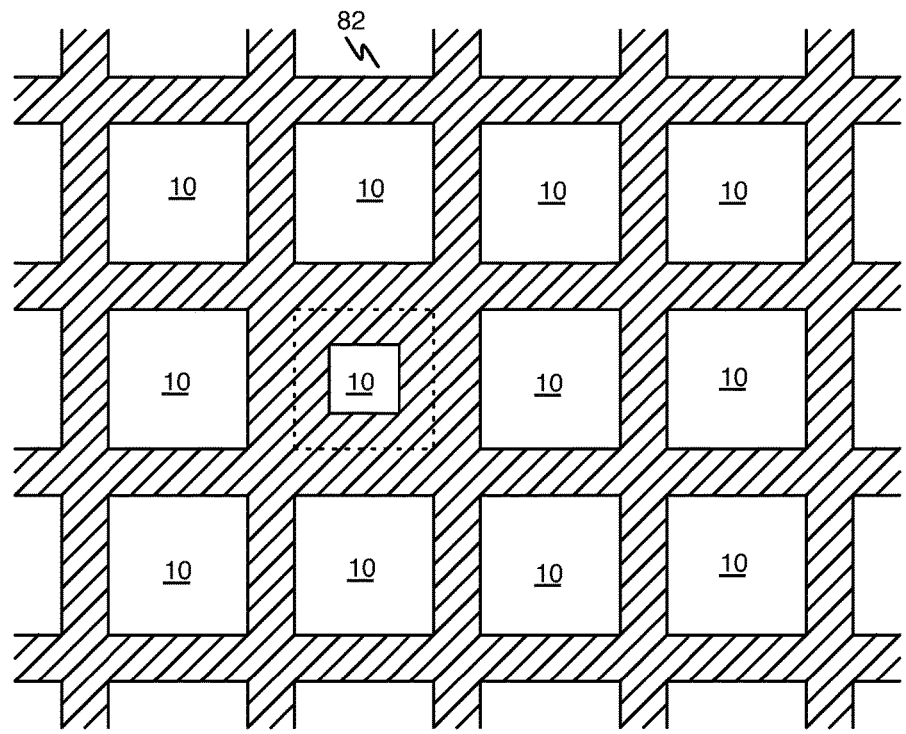
FIG. 6 is a diagram showing an illustrative form of a portion of a grid placed over the pixel array to define reduced sensitivity pixels in accordance with the present invention.

Another possible variation of employing the light shield only over isolated reduced-sensitivity pixels would be also form a grid over the pixel array. This is illustrated as a layout in FIG. 6. In this case, if the light shield is formed as a metal grid, it could be used as an additional electrical layer such as a power plane. The formation of the grid may also serve to better manufacture the reduced sensitivity pixels.

As disclosed above, the difference in sensitivity between the normal pixels and the reduced-sensitivity pixels is due to the difference in aperture size for the pixel. Persons of ordinary skill in the art will realize that other techniques could be used to form pixels having two different sensitivities. Such techniques include, but are not limited to, use of different doping levels in different pixels and forming a layer of material having reduced optical transmissivity over the reduced-sensitivity pixel.

Figure 7:
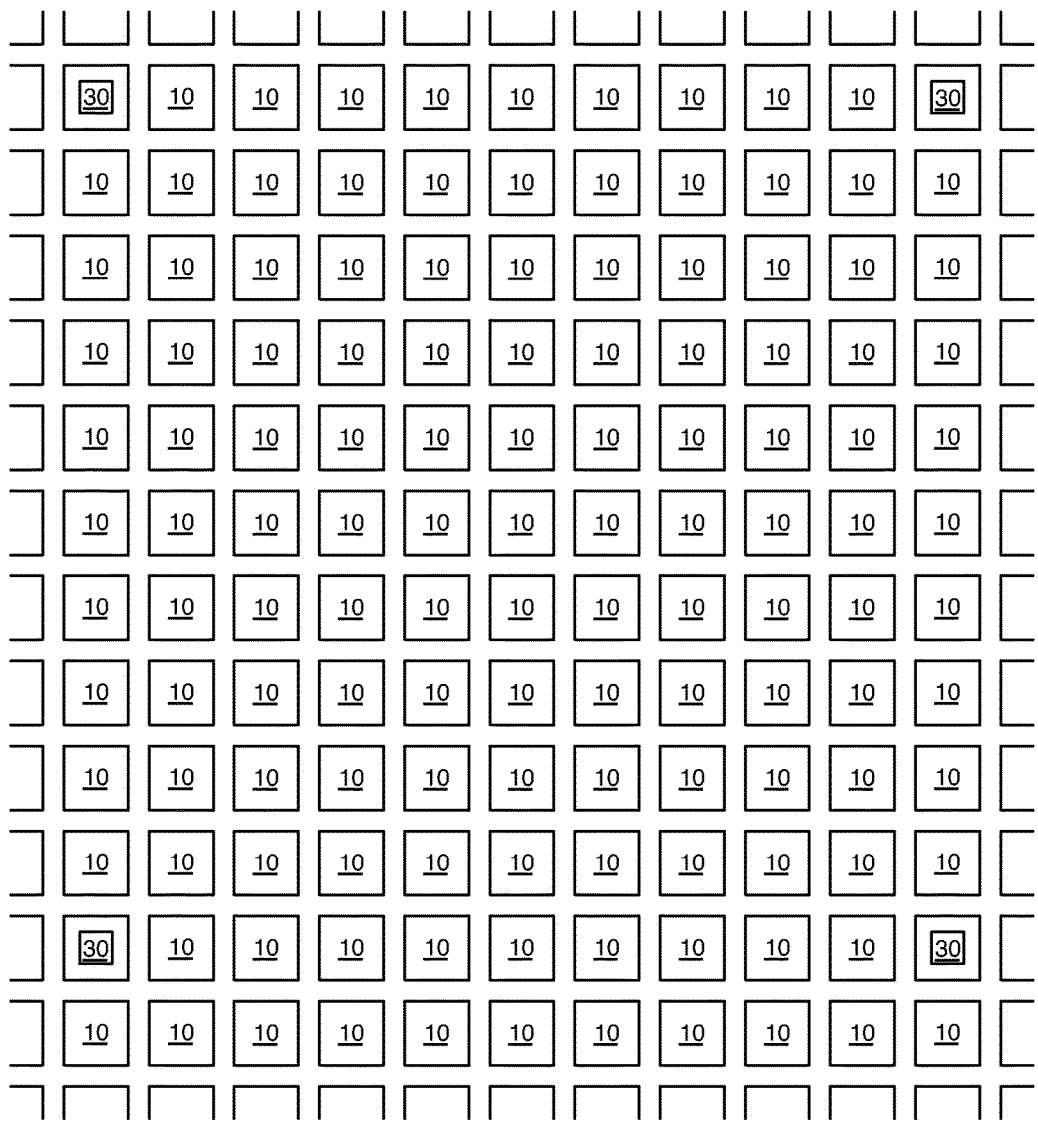
FIG. 7 is a diagram showing a portion of an illustrative pixel array according to the present invention including reduced-sensitivity pixels placed in a regular fashion in accordance with the present invention.

According to one aspect of the present invention, the reduced sensitivity pixels are placed in a regular fashion over the entire imaging array. The reduced sensitivity pixels are spaced out so as to not compromise the overall quality of the image but to supplement the image processing for highlight data. One exemplary placement of the pixels according to the present invention is approximately every 2 to 100 pixels on a given row and column, but persons of ordinary skill in the art will appreciate that different spacings, such as periodic, pseudo-random, and random, could be employed. The result is that the reduced sensitivity pixels may account for between about 40% and about 0.01% of the total number of pixels. In one example, shown in FIG. 7, an arrangement including one reduced sensitivity pixel for every 10×10 pixel region. Persons of ordinary skill in the art will appreciate that an appropriate ratio can be selected depending on the size of the pixels and array.

Figure 8:
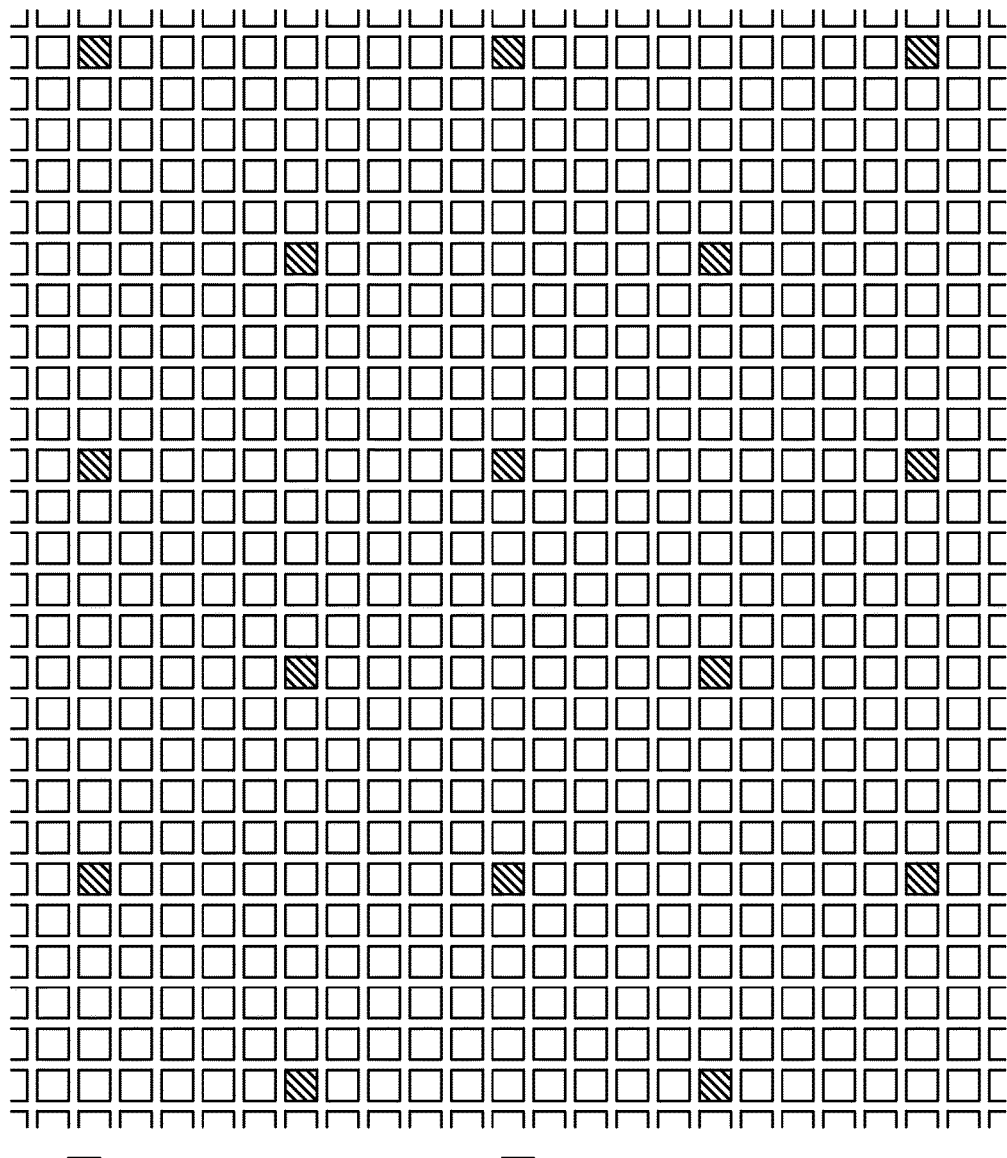
FIG. 8 is a diagram showing a portion of an illustrative pixel array according to the present invention including reduced-sensitivity pixels placed in regular fashion in a diamond pattern in accordance with the present invention.

Referring now to FIG. 8, another illustrative highlight pixel layout/arrangement is shown wherein the highlight pixels are arranged in a diamond pattern. Generally, such a diamond pattern is created by first creating a regular spacing similar to the one in FIG. 7 and then adding a highlight pixel in a center of a square of four existing highlight pixels. FIG. 8 shows an example arrangement where the highlight pixels are placed every tenth pixel both horizontally and vertically, and every fifth pixel diagonally.

The concept introduced in the present invention is applicable to any photodiode layout, such as various periodic, pseudo-random, and random arrangements of photodiodes having lower light sensitivity in the array of photodiodes having normal light sensitivity. In addition, the present invention is not limited to any particular sensitivity setting, as the presented concept is flexible and allows for photodiodes having different sensitivities.

In regions with saturated signal values, the pixel values corresponding to photodiodes having lower light sensitivity are obtained by applying the appropriate highlight pixel gains to produce a reference signal. Such reference signal values may then be used to restore the image information in pixel locations corresponding to photodiodes with normal light sensitivity by mapping the characteristics of reference signal values to saturated pixels, for instance, by combining the available reference signal values and nonsaturated pixel values corresponding to photodiodes with normal light sensitivity.

An alternative solution can aim at restoring the pixel values corresponding to photodiodes having normal light sensitivity using neighboring pixel values corresponding to photodiodes having lower light sensitivity by means of image interpolation or signal estimation. As will be readily appreciated by persons of ordinary skill in the art, depending on the actual implementation, the highlight pixel gains can be applied to pixel values corresponding to photodiodes having lower light sensitivity either prior to performing the restoration process or directly during the restoration process.

Figure 9:
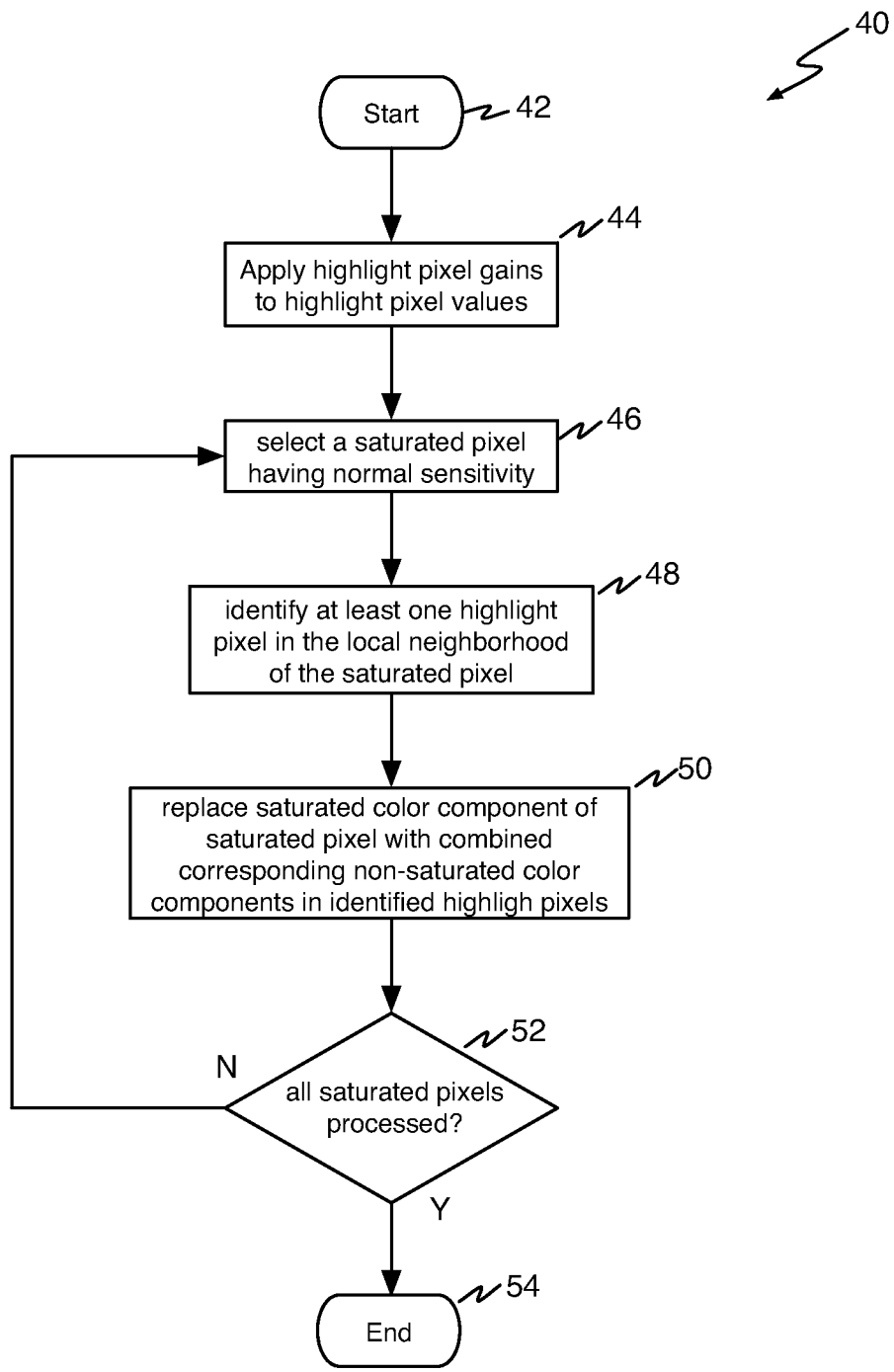
FIG. 9 is a flow diagram showing an illustrative image restoration method according to the present invention.

An exemplary method 40 according to the present invention is shown with reference to FIG. 9. The process begins at reference numeral 42. At reference numeral 44, highlight pixel gains are applied to the highlight pixel values. Then, at reference numeral 46, a saturated pixel having normal light sensitivity is located. At reference numeral 48, a set of (one or more) highlight pixels is identified in a local neighborhood of the saturated pixel. A local neighborhood may be defined using a square or circular window with the size constrained so that at least one highlight pixel is located inside this window. The center of such a window is usually placed at the normal light sensitivity pixel that is being corrected or restored. Alternatively, one or more spatially closest highlight pixels to the normal light sensitivity pixel that is being corrected or restored are located. The minimum number of such spatially closest highlight pixels can be predetermined.

At reference numeral 50, the saturated color component of the pixel having normal light sensitivity is replaced by combining the corresponding nonsaturated color components in the locally available highlight pixels. The replacement can be performed as the average or weighted average of the corresponding nonsaturated color components in locally available highlight pixels. The weights can be calculated as inversely proportional to the spatial distance (e.g., absolute or Euclidean) between the pixel location being restored and the pixel locations of the available highlight pixels, or in general the weights should reduce with increased spatial distance. Alternatively, the weights can be calculated as inversely proportional to the difference between the pixel being restored and the locally available highlight pixels (note that all the color components or at least components from nonsaturated color channels can be used), or in general the weights should reduce with the increased pixel value differences. Alternatively, the weights can be calculated by combining (e.g. multiplication) both spatial and intensity differences. Regardless of how the weights are calculated, they should be normalized (their sum should equal to unity) prior to performing weighted averaging in order to produce an unbiased estimate.

At reference numeral 52, it is determined whether all saturated pixels have been processed. If not, the process returns to reference numeral 46 where another saturated pixel having normal light sensitivity is located. If all saturated pixels have been processed, the process ends at reference numeral 54.

Figure 10:
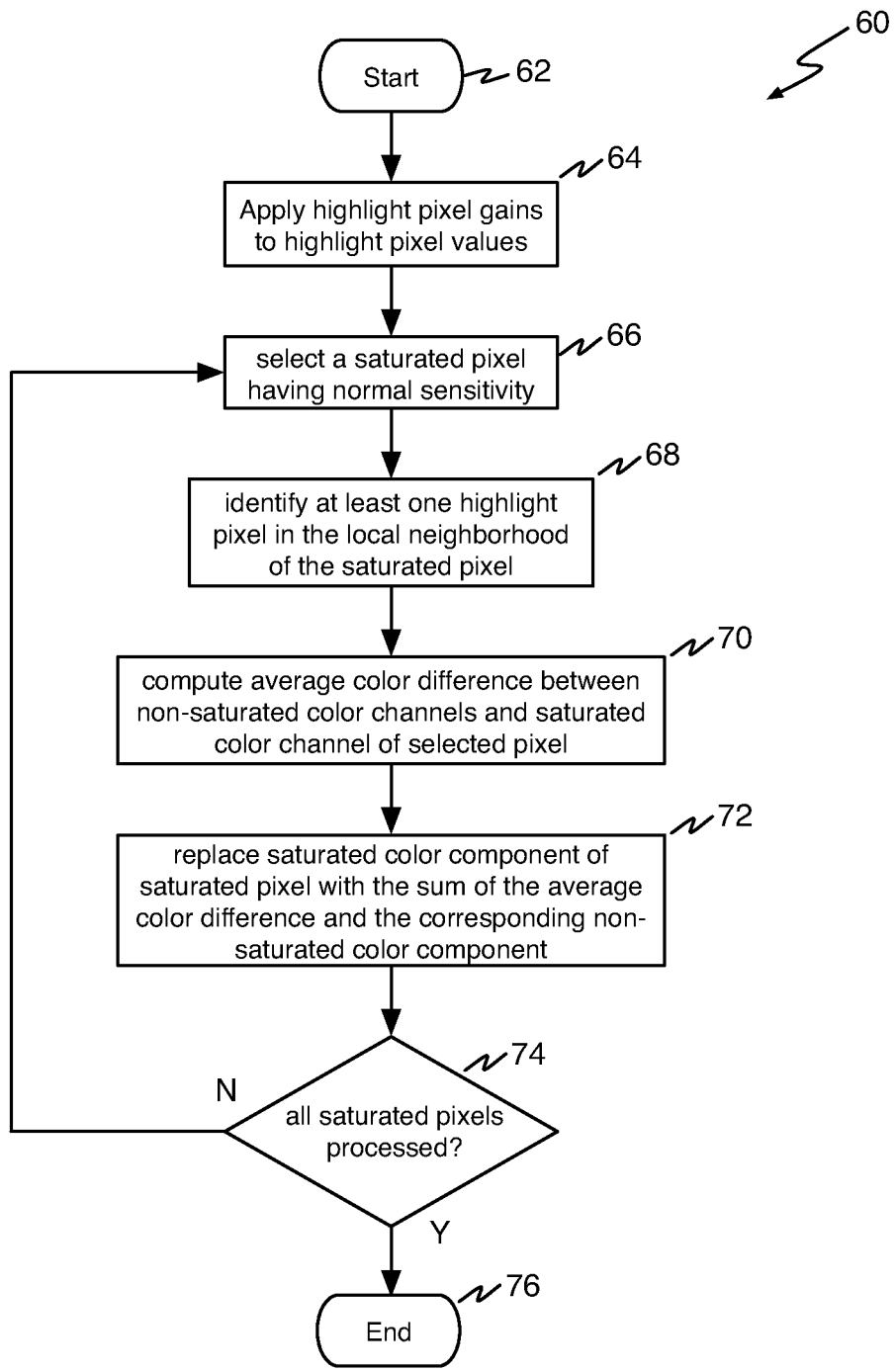
FIG. 10 is a flow diagram showing another illustrative image restoration method according to the present invention.

Another exemplary method 60 according to the present invention is shown in FIG. 10. In the method 60 of FIG. 10, the restoration process is performed using color differences instead of intensity values from the color channel being restored. In this case, a saturated color channel is restored by adding the average or weighted average color difference (between the nonsaturated color channels and the saturated color channel, as observed in the pixel location being restored) of the available highlight pixels to the nonsaturated color component in the pixel location being restored. For example, if both green and blue channels are saturated in the normal light sensitivity pixel, then that green component can be restored by adding the nonsaturated red component of the normal light sensitivity pixel to the average color difference between gained green and red components of locally available highlight pixels. In a similar way, the saturated blue component of the normal light sensitivity pixel can be restored by adding the nonsaturated red component of the normal light sensitivity pixel to the average color difference between gained blue and red components of locally available highlight pixels.

The process begins at reference numeral 62. At reference numeral 64, highlight pixel gains are applied to the highlight pixel values. Then, at reference numeral 66, a saturated pixel having normal light sensitivity is located. At reference numeral 68, a set of (one or more) highlight pixels is identified in a local neighborhood of the saturated pixel. As with the method of FIG. 9, a local neighborhood may be defined using a square or circular window with the size constrained so that at least one highlight pixel is located inside this window. The center of such a window is usually placed at the normal light sensitivity pixel that is being corrected or restored. Alternatively, one or more spatially closest highlight pixels to the normal light sensitivity pixel that is being corrected or restored are located. The minimum number of such spatially closest highlight pixels can be predetermined.

At reference numeral 70, the average or weighted average color difference (between the nonsaturated color channels and the saturated color channel, as observed in the pixel location being restored) is calculated using color components of locally available highlight pixels. At reference numeral 72, this color difference is added to the corresponding nonsaturated component of the normal light sensitivity pixel in order to restore its saturated color component.

At reference numeral 74, it is determined whether all saturated pixels have been processed. If not, the process returns to reference numeral 66 where another saturated pixel having normal light sensitivity is located. If all saturated pixels have been processed, the process ends at reference numeral 76.

If only one color channel is saturated, then the result can be obtained by combining the samples restored using two various color difference signals (since there are two nonsaturated color channels). Persons of ordinary skill in the art will appreciate that color difference calculations can be replaced with ratios, the result is obtained by multiplying the nonsatured color component in the location being restored and the average or weighted average color ratio calculated using the pixel values of the available highlight pixels.

According to another aspect of the present invention, methods in which at least one table of correction factors is created using the highlight pixels disclosed herein or the non-saturated normal light-sensitivity pixels and the highlight pixels disclosed herein can be used to restore saturated pixels.

As in the previous exemplary methods, highlight pixel gains can be applied to the highlight pixel values prior to performing the restoration process or directly during the restoration process. According to one aspect of the invention the entire image, including highlight pixels, is analyzed for pixels where the color channel in question is not saturated. Alternatively, only highlight pixels are analyzed for pixels where the color channel in question is not saturated. This can be combined with other constraints, for example, the pixels to be used in building the table of correction factors have to have their luminance value larger than a certain threshold and cannot have any of their color channels clipped (saturated), etc. For each of these pixels that are selected to build this correction table at least two values are calculated, each a function of one or more color channels. One value is used as an index into the table of correction factors, whereas the other value is the correction factor itself. Note that the method of the present invention allows calculating more than one correction factor if such operational characteristics are required.

The number of entries in the table of correction factors is denoted by the table size a. This design parameter is usually predetermined. Typically, a is set as smaller than or equal to the number of bits used to represent each color channel. Memory efficient implementations may target smaller a values (for instance, a=255 for 12 bits per color channel representation); however, too small values may reduce the accuracy of correction since too different pixels will be associated with the same index.

The index value is a function of one or more color channels. Consider the B channel being corrected and M being the design parameter, usually equal to the maximum allowed value in a given bit representation (other settings are also possible). In one example, the index is a function of one or two color channels not being restored; for instance, such a function can be defined as $a\min(R,M)/M$, $a\min(G,M)/M$, $aR/(R+G)$, or $aG/(R+G)$, with min denoting the minimum operator and R, G, and B denoting the red, green, and blue color component, respectively. In another example, the index is a function of the color channel being restored; for instance, such a function can be defined as $a\min(B,M)/M$. In yet another example, the index is a function of the color channel being restored and one or both other color channels; for instance, such a function can be defined as $aB/(R+G+B)$. Note that the final index is a rounded version of the index value calculated as described above.

The correction factors can also be determined in more than one way. Consider again the B channel being corrected. In one example, the correction factor is calculated as a scaled value of the color channel being corrected; that is, yB where y is either predetermined or adaptively determined based on image statistics. In another example, the correction factor is calculated as a ratio of the color channel to be corrected to one of the other two color channels in the pixel; for instance, such a correction factor can be defined as B/G, or B/R. In another example, the correction factor is calculated as a difference between the color channel to be corrected and one of the other two color channels in the pixel, that is, B−G or B−R for instance. In another example, the correction factor is calculated as a function of the color channel to be corrected and both other color channels in the pixel; for instance, such a function can be defined as $2B-R-G$, $2B/(R+G)$, or $B^2/(RG)$. In yet another example, two correction factors are calculated as a ratio or a difference between the color channel to be corrected and each of the other two color channels. Since different pixels corresponding to the same index value can produce different correction factors for the same correction factor calculation approach, the final correction factor stored in the table of correction factors is calculated as a function of pixelwise correction factors. In one example, the correction factors for all of the pixels that correspond to the same index are averaged. In another example, different correction factors of the pixels with the same index have different weights; these weights can be derived as a function of some predetermined criterion, such as histogram, distance from a certain value, etc. Once the entire image has been examined to populate the table of correction factors, any gaps remaining in the table of correction factors are filled in by interpolating the existing entries.

The restoration procedure examines each pixel in the image. First, the index to the correction table is calculated (using the same approach that was used to generate the table) to obtain an appropriate correction factor for a given pixel. Consider again the B channel being corrected. If the correction factor is determined using the same color channel as yB, then its value directly represents the corrected output. In all other cases, the unsaturated color component from the pixel being corrected is combined with the corresponding correction factor (i.e., multiplying it with the color ratio-based factors, or adding it to the color difference-based factors) by following the inverse calculations with respect to correction factor calculations. Note that if more than one table of correction factors has been generated for the same color channel, the final corrected value can be obtained as a combination of corrected values obtained using each of such tables. Any attempt at restoration can be skipped if all three channels of a pixel are saturated.

Although all above-listed examples consider B channel as a channel being corrected, application of the proposed method to other channels is straightforward and will not be discussed here.

Figure 11:
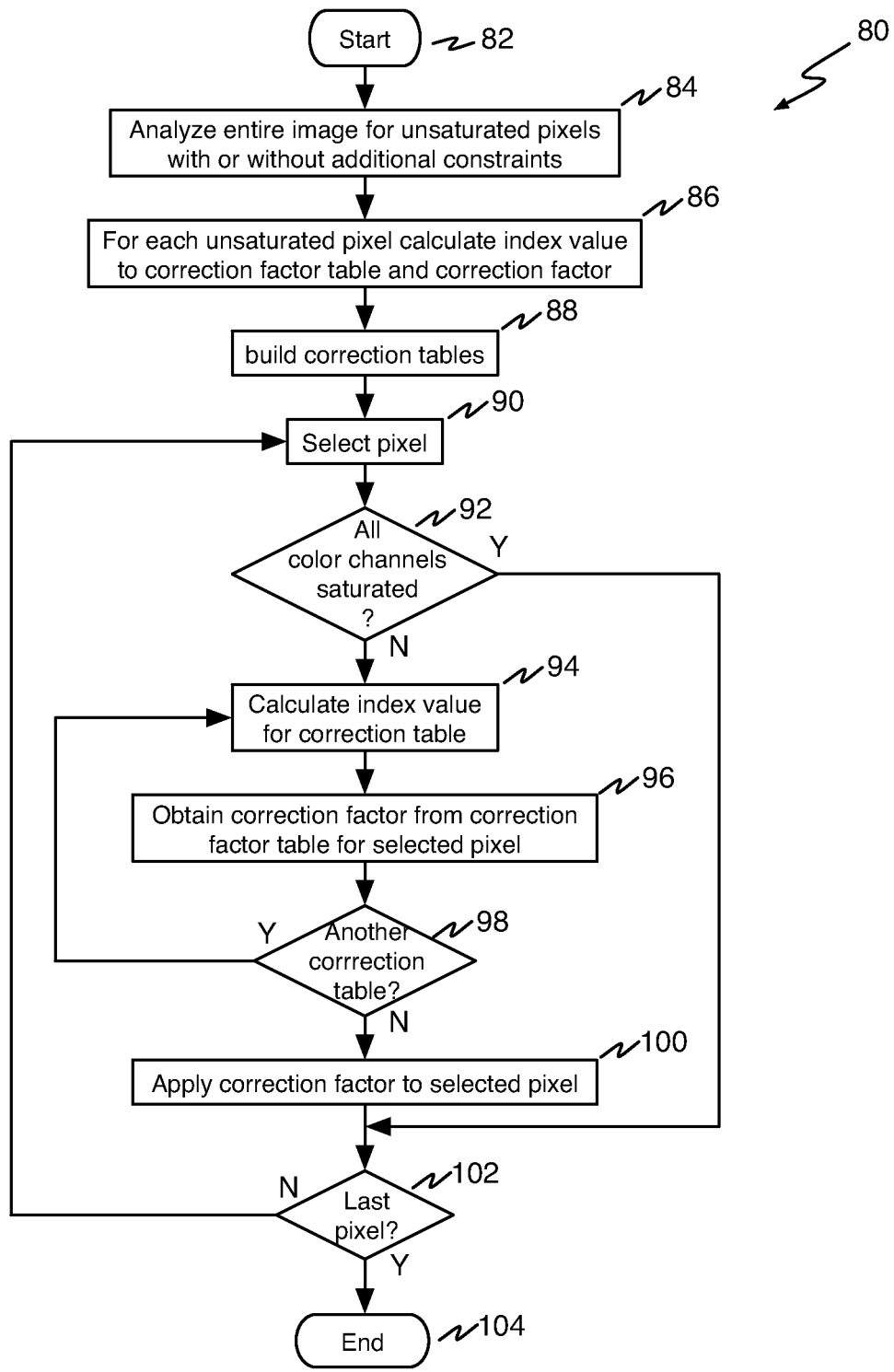
FIG. 11 is a flow diagram showing another illustrative image restoration method according to the present invention

Referring now to FIG. 11 a flow diagram shows an illustrative method 80 for building a table of correction factors and applying them to an image according to an aspect of the present invention. The method begins at reference numeral 82.

At reference numeral 84, the entire image is analyzed for pixels where the color channel in question is not saturated. This can be combined with other constraints, for example, the pixels to be used in building the table of correction factors have to have their luminance value larger than a certain threshold and/or cannot have any of their color channels clipped (saturated), etc.

For each of the pixels that are selected to build the correction table at least two values are calculated, each a function of one or more color channels. One value is used as an index into the table of correction factors, whereas the other value is the correction factor itself. At reference numeral 86, the index value for the correction table is calculated and the value of the correction factor is calculated. Persons of ordinary skill in the art will observe that the order in which these calculations are performed is unimportant. Note that the method of the present invention contemplates calculating more than one correction factor if such operational characteristics are required.

The number of entries in the table of correction factors is denoted by the table size a. This design parameter is usually predetermined. Typically, a is set as smaller than or equal to the number of bits used to represent each color channel; however, too small value of a may reduce the accuracy of correction since too different pixels will be associated with the same index.

The index value is a function of one or more color channels. Consider the B channel being corrected and M being the design parameter, usually equal to the maximum allowed value in a given bit representation (other settings are also possible). In one example, the index is a function of one or two color channels not being restored; for instance, such a function can be defined as amin(R,M)/M, amin(G,M)/M, aR/(R+G), or aG/(R+G), with min denoting the minimum operator and R, G, and B denoting the red, green, and blue color component, respectively. In another example, the index is a function of the color channel being restored; for instance, such a function can be defined as amin(B,M)/M. In yet another example, the index is a function of the color channel being restored and one or both other color channels; for instance, such a function can be defined as aB/(R+G+B). Note that the final index is a rounded version of the index value calculated as described above.

The correction factors can also be determined in more than one way. Consider again the B channel being corrected. In one example, the correction factor is calculated as a scaled value of the color channel being corrected; that is, yB where y is either predetermined or adaptively determined based on image statistics. In another example, the correction factor is calculated as a ratio of the color channel to be corrected to one of the other two color channels in the pixel; for instance, such as a correction factor can be defined as B/G, or B/R. In another example, the correction factor is calculated as a difference between the color channel to be corrected and one of the other two color channels in the pixel, that is, B−G or B−R for instance. In another example, the correction factor is calculated as a function of the color channel to be corrected and both other color channels in the pixel; for instance, such a function can be defined as 2B−R−G, 2B/(R+G), or $B^2$/(RG). In yet another example, two correction factors are calculated as a ratio or a difference between the color channel to be corrected and each of the other two color channels. Since different pixels corresponding to the same index value can produce different correction factors for the same correction factor calculation approach, the final correction factor stored in the table of correction factors is calculated as a function of pixelwise correction factors. In one example, the correction factors for all of the pixels that correspond to the same index are averaged. In another example, different correction factors of the pixels with the same index have different weights; these weights can be derived as a function of some predetermined criterion, such as histogram, distance from a certain value, etc.

Once the entire image has been examined, at reference numeral 88 the table of correction factors is populated and any gaps remaining in the table of correction factors are filled in by interpolating the existing entries. In some cases, more than one table of correction factors may be created. Persons of ordinary skill in the art will recognize that the correction table can be built incrementally as the index values and correction factors are determined.

The restoration procedure examines each pixel in the image based on the saturation map. At reference numeral 90, a pixel is selected. At reference numeral 92, it is determined whether all color channels of the pixel are saturated. If not, the pixel may be processed and at reference numeral 94 the index value for the pixel is calculated (using the same approach that was used to generate the table).

At reference numeral 96 the index value is used to address the correction table to obtain the correction factor.

In some instances more than one correction table is being employed and the final correction value can be obtained as a combination of corrected values obtained using each of such tables. At reference numeral 98, it is determined whether an additional correction table is in use. If so, the process returns to reference numerals 94, and 96 to obtain the additional correction factor. If all correction factor tables have been accessed and correction factors determined, at reference numeral 100 the obtained correction factor is applied to the pixel to produce the corrected pixel value. If the correction factor is determined using the same color channel as yB, then its value directly represents the corrected output. In all other cases, the unsaturated color component from the pixel being corrected is combined with the corresponding correction factor (i.e., multiplying it with the color ratio-based factors, or adding it to the color difference-based factors) by following the inverse calculations with respect to correction factor calculations. The corrected pixel value is directly produced if only one correction table was used. Otherwise, all of the obtained correction factors are applied to the pixel to combine intermediate corrected pixel values if more than one correction table was used. Then, the final corrected pixel value is stored.

At reference numeral 102, it is determined whether all pixels in the image have been processed. If not, the process returns to reference numeral 90 where another pixel is selected for processing. If all pixels in the image have been processed the process ends at reference numeral 104.

According to another aspect of the present invention, the two approaches, one based on the correction table and another that uses highlight pixels available in a local neighborhood, can be combined. In example implementations, each saturated pixel can be corrected as the average or weighted average of the two intermediate pixels produced using these two approaches. In such weighted average calculations, the summation of the weights should be equal to one in order to produce an unbiased estimate. According to another aspect of the present invention, the table of correction factors can be calculated using one or more regions of the actual image being restored; these regions can be automatically determined based on image statistics and/or selected by the user. According to yet another aspect of the present invention, the table of correction factors can be calculated independently (for instance, in calibration) on the actual image being restored.

In addition to highlight regions, the image restoration concept presented in the present invention can also be used to enhance the quality and performance of image processing for high ISO captures. In such scenarios, it may be desired to combine photodiodes having normal sensitivity and photodiodes having higher sensitivity as the latter ones will be less affected by noise introduced to the image during the image acquisition process. Here, assuming that the pixel values captured by pixels having higher sensitivities are scaled down by applying the proper gains, the noisiest one or two color channels can be restored using the other one or two color channels from the pixels having higher sensitivity by applying the signal processing concepts described herein (instead of saturated channels, considered here are the noisiest channels or the channels with lowest sensitivity). Note that this strategy can be applied in all pixel locations or in some selected regions according to some predetermined criteria (e.g., low-light regions, regions with some desired color and structural characteristics, etc.).

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A pixel sensor array comprising:
a first plurality of photodiode pixel sensors having a first light-sensitivity, each of the first plurality of pixel sensors having a plurality of color components; and
a second plurality of photodiode pixel sensors having a second light-sensitivity less than the first light-sensitivity, each of the second plurality of pixel sensors having the plurality of color components, the number of the second plurality of photodiode pixel sensors in the array being fewer than the number of the first plurality of pixel sensors in the array, no two of the second plurality of pixel sensors being immediate neighbors to one another in both a row direction and a column direction in the array.

2. The pixel sensor array of claim 1 wherein the second plurality of photodiode pixel sensors is dispersed evenly in the array.

3. The pixel sensor array of claim 1 wherein the first plurality of photodiode pixel sensors each have a light-admitting aperture of a first area and the second plurality of photodiode pixel sensors each have a light-admitting aperture of a second area smaller in size than the first area.

4. The pixel sensor array of claim 2 wherein placement of the second plurality of pixel sensors in the array is between about every 2 to about every 100 pixels on each row and column of the array.

5. In an image captured by an image sensor array having a first plurality of pixel sensors having a first light-sensitivity and a second plurality of pixel sensors separate from the first plurality of pixel sensors and having a second light-sensitivity less than the first light-sensitivity, each of the first plurality of pixel sensors and the second plurality of pixel sensors having a plurality of color components, the number of second plurality of single-photodiode pixel sensors in the array being fewer than the number of first plurality of pixel sensors in the array, and no two of the second plurality of pixel sensors being immediate neighbors to one another in both a row direction and a column direction in the array, a method for correcting saturated pixel data captured by the first plurality of pixel sensors comprising:
a) applying pixel gains to pixel values from the second plurality of pixel sensors;
b) selecting a pixel with at least one saturated color component in the first plurality of pixel sensors;
c) identifying more than one of the second plurality of pixel sensors in a local neighborhood of the selected first pixel sensor;
d) replacing the saturated color component of the selected pixel data by combining corresponding nonsaturated color components of pixels identified in the second plurality of pixel sensors; and
e) repeating b) through d) until pixel data from all saturated pixel sensors have been processed.

6. The method of claim 5 wherein replacing the saturated color component of the selected pixel data comprises replacing the saturated color component of the selected pixel data with an average of corresponding nonsaturated color components of pixels identified in the second plurality of pixel sensors in the local neighborhood of the selected first pixel sensor.

7. The method of claim 5 wherein replacing the saturated color component of the selected pixel data comprises replacing the saturated color component of the selected pixel data with a weighted average of corresponding nonsaturated color components of pixels identified in the second plurality of pixel sensors in the local neighborhood of the selected first pixel sensor.

8. The method of claim 7 wherein weight of the nonsaturated color component of a pixel identified in the second plurality of pixel sensors in the local. neighborhood of the selected first pixel sensor is determined as a function of spatial distance between the identified pixel and the selected pixel.

9. The method of claim 8 wherein weight of the nonsaturated color component of a pixel identified in the second plurality of pixel sensors in the local neighborhood of the selected first pixel sensor is inversely proportional to spatial distance between the identified pixel and the selected pixel.

10. The method of claim 7 wherein weight of the non-saturated color component of a pixel identified in the second plurality of pixel sensors in the local neighborhood of the selected first pixel sensor is determined as a function of difference between data value of the identified pixel and data value of the selected pixel.

11. The method of claim 10 wherein weight of the nonsaturated color component of a pixel identified in the second plurality of pixel sensors in the local neighborhood of the selected first pixel sensor is inversely proportional to a difference between data value of the identified pixel and data value of the selected pixel.

12. The method of claim 7 wherein weight of the non-sarurated color component of a pixel identified in the second plurality of pixel sensors in the local neighborhood of the selected first pixel sensor is determined as a function a combination of spatial distance between and difference between data value of the identified pixel and the selected pixel.

* * * * *

UNITED STATES PATENT AND TRADEMARK OFFICE
CERTIFICATE OF CORRECTION

PATENT NO. : 9,942,495 B2
APPLICATION NO. : 14/942700
DATED : April 10, 2018
INVENTOR(S) : Rastislav Lukac, Shri Ramaswami and Sanghoon Bae It is certified that error appears in the above-identified patent and that said Letters Patent is hereby corrected as shown below:

In the Claims

In Claim 12, Column 12, Lines 46-47, delete "nonsarurated" and insert --nonsaturated--.

Signed and Sealed this
Twenty-fourth Day of July, 2018

Andrei Iancu
*Director of the United States Patent and Trademark Office*